United States Patent
Min et al.

(10) Patent No.: US 11,122,694 B2
(45) Date of Patent: Sep. 14, 2021

(54) PRINTED CIRCUIT BOARD AND PACKAGE HAVING THE SAME

(71) Applicant: Samsung Electro-Mechanics Co., Ltd., Suwon-si (KR)

(72) Inventors: Tae-Hong Min, Suwon-si (KR); Ju-Ho Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/676,493

(22) Filed: Nov. 7, 2019

(65) Prior Publication Data
US 2020/0178401 A1   Jun. 4, 2020

(30) Foreign Application Priority Data
Dec. 4, 2018 (KR) .......... 10-2018-0154656

(51) Int. Cl.
| | |
|---|---|
| H05K 1/02 | (2006.01) |
| H05K 1/03 | (2006.01) |
| H05K 1/09 | (2006.01) |
| H05K 1/11 | (2006.01) |
| H05K 1/14 | (2006.01) |
| H05K 1/18 | (2006.01) |
| H05K 3/00 | (2006.01) |
| H05K 3/22 | (2006.01) |

(Continued)

(52) U.S. Cl.
CPC .......... *H05K 3/4691* (2013.01); *H05K 1/145* (2013.01); *H05K 3/22* (2013.01); *H05K 2201/0187* (2013.01)

(58) Field of Classification Search
CPC .. H05K 1/02; H05K 1/03; H05K 1/09; H05K 1/11; H05K 1/14; H05K 1/18; H05K 1/145; H05K 3/00; H05K 3/22; H05K 3/32; H05K 3/40; H05K 3/46; G06K 19/077
USPC .......... 361/749, 737, 764; 343/700 MS, 702, 343/788, 841, 852, 866, 870, 873, 893, 343/895, 905; 340/12.22, 572.1, 572.7, 340/572.8; 174/254
See application file for complete search history.

(56) References Cited

U.S. PATENT DOCUMENTS

| | | | |
|---|---|---|---|
| 6,353,420 B1 * | 3/2002 | Chung | B32B 3/08 343/895 |
| 6,404,643 B1 * | 6/2002 | Chung | H01Q 23/00 361/737 |

(Continued)

FOREIGN PATENT DOCUMENTS

| | | |
|---|---|---|
| KR | 10-2004-0085374 A | 10/2004 |
| KR | 10-2016-0130290 A | 11/2016 |

(Continued)

OTHER PUBLICATIONS

Korean Office Action dated Apr. 20, 2021 in counterpart Korean Patent Application No. 10-2018-0154656 (9 pages in English, 7 pages in Korean).

*Primary Examiner* — Xiaoliang Chen
(74) *Attorney, Agent, or Firm* — NSIP Law

(57) ABSTRACT

A printed circuit board including: a laminate having a plurality of stacked insulating layers including a rigid insulating layer; a flexible insulating layer having a partial region that overlaps and is in contact with at least one of the insulating layers and a remaining region disposed outside of the laminate; and a first antenna disposed on a surface of the laminate.

14 Claims, 6 Drawing Sheets

(51) Int. Cl.
*H05K 3/32* (2006.01)
*H05K 3/40* (2006.01)
*H05K 3/46* (2006.01)
*G06K 19/077* (2006.01)

(56) References Cited

U.S. PATENT DOCUMENTS

| | | | | |
|---|---|---|---|---|
| 6,421,013 | B1* | 7/2002 | Chung | G06K 19/07749 343/700 MS |
| 9,761,516 | B1* | 9/2017 | Knickerbocker | H01L 23/49811 |
| 2003/0159504 | A1* | 8/2003 | Barguirdjian | B32B 17/10293 73/170.17 |
| 2003/0174099 | A1* | 9/2003 | Bauer | G06K 7/0008 343/893 |
| 2005/0024290 | A1* | 2/2005 | Aisenbrey | H01Q 1/36 343/873 |
| 2007/0040688 | A1* | 2/2007 | Cocita | G06K 19/07749 340/572.7 |
| 2007/0046475 | A1* | 3/2007 | Carrender | H01Q 1/20 340/572.7 |
| 2007/0171078 | A1* | 7/2007 | Cotton | G06K 19/0723 340/572.8 |
| 2010/0025087 | A1* | 2/2010 | Takahashi | H05K 3/4691 174/254 |
| 2010/0066615 | A1* | 3/2010 | Okayama | H01Q 1/38 343/702 |
| 2010/0155109 | A1* | 6/2010 | Takahashi | H05K 3/4691 174/254 |
| 2010/0326703 | A1* | 12/2010 | Gilad | A61B 1/041 174/254 |
| 2011/0062244 | A1* | 3/2011 | Kato | G06K 19/07749 235/492 |
| 2011/0096388 | A1* | 4/2011 | Agrawal | G02F 1/155 359/268 |
| 2011/0169698 | A1* | 7/2011 | Niemi | H01Q 1/243 343/702 |
| 2011/0180306 | A1* | 7/2011 | Naganuma | H05K 1/115 174/254 |
| 2011/0180307 | A1* | 7/2011 | Naganuma | H05K 3/4691 174/254 |
| 2011/0199739 | A1* | 8/2011 | Naganuma | H05K 3/4691 361/749 |
| 2011/0203837 | A1* | 8/2011 | Naganuma | H05K 3/4691 174/254 |
| 2012/0055013 | A1* | 3/2012 | Finn | H05K 3/103 29/600 |
| 2012/0181068 | A1* | 7/2012 | Kato | H05K 3/4691 174/254 |
| 2012/0218165 | A1* | 8/2012 | Kato | H01P 1/2135 343/852 |
| 2012/0326931 | A1* | 12/2012 | Murayama | H01Q 7/00 343/702 |
| 2014/0028518 | A1* | 1/2014 | Arnold | H01L 23/66 343/841 |
| 2014/0073270 | A1* | 3/2014 | Chou | G06F 3/0416 455/90.2 |
| 2014/0104133 | A1* | 4/2014 | Finn | H01Q 1/2283 343/866 |
| 2014/0168026 | A1* | 6/2014 | Nakamura | H01Q 7/00 343/788 |
| 2014/0184950 | A1* | 7/2014 | Chu | G06F 3/041 349/12 |
| 2015/0114690 | A1* | 4/2015 | Ishihara | H05K 3/4691 174/251 |
| 2015/0269471 | A1* | 9/2015 | Finn | G06K 19/07794 235/492 |
| 2015/0269472 | A1* | 9/2015 | Finn | G06K 19/07794 235/492 |
| 2015/0269474 | A1* | 9/2015 | Finn | H01Q 1/38 235/492 |
| 2015/0278675 | A1* | 10/2015 | Finn | G06K 19/07747 235/492 |
| 2015/0380848 | A1* | 12/2015 | Kato | H01R 12/78 439/67 |
| 2016/0020165 | A1 | 1/2016 | Kamgaing et al. | |
| 2016/0110639 | A1* | 4/2016 | Finn | B23K 26/361 235/439 |
| 2016/0270220 | A1* | 9/2016 | Omote | H05K 5/064 |
| 2016/0379481 | A1* | 12/2016 | Kim | G08C 17/02 340/12.22 |
| 2016/0381784 | A1* | 12/2016 | Miura | H05K 1/16 343/860 |
| 2017/0095210 | A1* | 4/2017 | Najafi | A61B 5/6869 |
| 2017/0196094 | A1* | 7/2017 | Mayr | H05K 3/32 |
| 2017/0279177 | A1* | 9/2017 | Oguri | H01P 3/08 |
| 2017/0290184 | A1* | 10/2017 | Kim | H04M 1/0277 |
| 2017/0358847 | A1* | 12/2017 | Cho | H05K 7/1427 |
| 2018/0146554 | A1* | 5/2018 | Kajihara | H05K 1/028 |
| 2018/0166239 | A1* | 6/2018 | Larson | H01H 47/001 |
| 2018/0196974 | A1* | 7/2018 | Hunziker | G06K 7/10316 |
| 2019/0022394 | A1* | 1/2019 | Fayram | A61N 1/36062 |
| 2019/0116664 | A1* | 4/2019 | Krivec | H05K 3/4691 |

FOREIGN PATENT DOCUMENTS

| | | |
|---|---|---|
| KR | 10-2018-0100146 A | 9/2018 |
| WO | WO 2017/051649 A1 | 3/2017 |

* cited by examiner

PRINTED CIRCUIT BOARD AND PACKAGE HAVING THE SAME

CROSS-REFERENCE TO RELATED APPLICATION

This application claims the benefit under 35 USC 119(a) of Korean Patent Application No. 10-2018-0154656, filed on Dec. 4, 2018, the entire disclosure of which is incorporated herein by reference for all purposes.

BACKGROUND

1. Field

The following description relates to a printed circuit board and a package including the same.

2. Discussion of Background

Countries around the world are concentrating on technology development for 5th Generation (5G) commercialization. In order to smoothly transmit signals in a frequency band of 10 GHz or more in the 5G era, it may be difficult to respond with existing materials and structures. Accordingly, a new material and structure for transmitting received high-frequency signals to a main board without loss are being developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: a laminate having a plurality of stacked insulating layers including a rigid insulating layer; a flexible insulating layer having a partial region that overlaps and is in contact with at least one of the insulating layers and a remaining region disposed outside of the laminate; and a first antenna disposed on a surface of the laminate.

In another general aspect, a package includes: a laminate having a plurality of stacked insulating layers including a rigid insulating layer; a flexible insulating layer having a partial region that overlaps and is in contact with at least one of the insulating layers and a remaining region disposed outside of the laminate; a first antenna disposed on a first surface of the laminate; and an electronic element disposed on a second surface of the laminate.

The printed circuit or package may include a second antenna disposed in the laminate and overlapping the first antenna.

The printed circuit board or package may include an additional antenna disposed in the laminate, and the additional antenna may be of a different type from the first antenna.

The printed circuit board or the package may include a second flexible insulating layer having a partial region disposed inside the laminate and a remaining region disposed outside of the laminate, and the flexible insulating layer and the second flexible insulating layer may be different layers.

The printed circuit board or the package may include a connection terminal disposed at an end of the remaining region of the flexible insulating layer; and an additional antenna disposed at an end of the remaining region of the second flexible insulating layer.

The flexible insulating layer and the second flexible insulating layer may extend outside the laminate in a same direction.

The printed circuit board or the package may include a plurality of identical second flexible insulating layers, and the second flexible insulating layers may be disposed in different layers in the laminate.

At least one of the insulating layers may be interposed between the flexible insulating layer and the second flexible insulating layer.

The flexible insulating layer and the second flexible insulating layer may extend outside the laminate in different directions.

The rigid insulating layer may include: a first rigid insulating layer; and a second rigid insulating layer disposed on both sides of the first rigid insulating layer, and the first rigid insulating layer may be thicker than the second rigid insulating layer.

The first antenna and the flexible insulating layer may be disposed on opposite sides of the first rigid insulating layer.

The printed circuit board or the package may include a second antenna disposed in the laminate and overlapping the first antenna, and the second antenna may be disposed on a surface of the first rigid insulating layer.

The printed circuit board or the package may include a solder resist layer stacked on both sides of the laminate.

The flexible insulating layer may be in contact with the solder resist layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
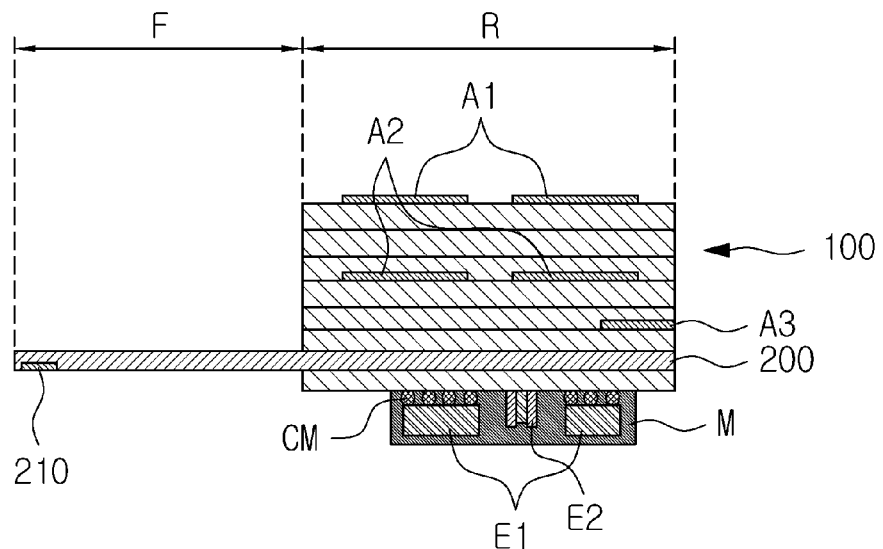
FIG. 1 is a diagram showing a printed circuit board and a package including the same according to an example.

The following detailed description is provided to assist the reader in gaining a comprehensive understanding of the methods, apparatuses, and/or systems described herein.

However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram showing a printed circuit board (PCB) and a package including the same according to an example.

The PCB includes a rigid portion R and a flexible portion F and is a rigid flexible board in which the rigid portion R and the flexible portion F are integrally formed. The PCB is distinguished from a board with a rigid board and a flexible board separately manufactured and then combined with each other through soldering bonding or the like.

Referring to FIG. 1, the PCB may include a laminate 100, a flexible insulating layer 200, and a first antenna A1.

The laminate 100 is formed by vertically stacking a plurality of insulating layers. The plurality of insulating layers includes a rigid insulating layer. All of the insulating layers may be rigid insulating layers. Alternatively, some of the insulating layers may be rigid insulating layers, and the other layers may be insulating layers that are more bendable than the rigid insulating layers.

The rigid insulating layer may be formed of an insulating material with a relatively low bendability and may include an epoxy resin and/or an imidazole resin. The rigid insulating layer may include a fiber reinforcing material such as glass fiber and may be a pre-preg, which is an epoxy resin containing the fiber reinforcing material. The rigid insulating layer may contain inorganic fillers.

When some of the insulating layers constituting the laminate 100 are rigid insulating layers and the other layers are insulating layers having a higher bendability than the rigid insulating layers, the insulating layers with a higher bendability than the rigid insulating layers may include at least one of polyimide (PI), liquid crystal polymer (LCP), polytetrafluoroethylene (PTFE), Teflon, perfluoroalkoxy (PFA), polyphenylene sulfide (PPS), polyphenylene ether (PPE), and polyphenylene oxide (PPO). The insulating layers having a higher bendability than the rigid insulating layers may have a dielectric dissipation factor (Df) of 0.004 or less.

The flexible insulating layer 200 may be formed of an insulating material that is more bendable and flexible than the rigid insulating layer and may include at least one of PI, LCP, PTFE, Teflon, PFA, PPS, PPE, and PPO. The Df of the flexible insulating layer 200 may be less than or equal to 0.002, which is lower than the Df of the plurality of insulating layers constituting the laminate 100.

The flexible insulating layer 200 may have a partial region in vertical contact with at least one of the plurality of insulating layers and a remaining region located on an outer side of the laminate 100. The partial region of the flexible insulating layer 200 may be located inside the laminate 100 and may be brought into vertical contact with two of the plurality of insulating layers. That is, the flexible insulating layer 200 may be interposed between the two insulating layers. Here, a layer in contact with the flexible insulating layer 200 among the plurality of insulating layers may be a rigid insulating layer, but the configuration is not limited thereto. The flexible insulating layer 200 may be stacked on the outermost surface of the laminate 100. In this case, the flexible insulating layer 200 may be in vertical contact with one of the plurality of insulating layers. The flexible insulating layer 200 may be understood by referencing FIG. 7.

In FIG. 1, the flexible insulating layer 200 located in the rigid portion R has the same length (transverse length in FIG. 1) as the laminate 100. However, unlike FIG. 1, the length of the flexible insulating layer 200 located in the rigid portion R may be shorter than the length of the laminate 100. In this case, an end of the rigid portion R of the flexible insulating layer 200 may be located inside the laminate 100 without being exposed to a side surface of the laminate 100.

A connection terminal 210 may be formed at an end of the flexible insulating layer 200 and, in particular, at an end located on an outer side of the laminate 100. The connection terminal 210 may be connected to an external board B (see FIG. 3). The connection terminal 210 may be connected to a terminal T of the external board B. The connection terminal 210 of the flexible insulating layer 200 and the terminal T of the external board B may be bonded to each other using a conductive member CM such as solder. The connection terminal 210 may be buried in the flexible insulating layer 200 or may protrude from the flexible insulating layer 200.

The PCB according an example, which is a rigid flexible board, includes the rigid portion R and the flexible portion F. The rigid portion R includes the laminate 100, in which the rigid insulating layer is included, and the flexible insulating layer 200, and the flexible portion F includes the flexible insulating layer 200 and does not include the rigid insulating layer. Even when an insulating layer having a higher bendability than the rigid insulating layer or a partial region of the flexible insulating layer 200 is included in the laminate 100, the bendability of the laminate 100 is reduced because a rigid insulating layer is included in the laminate 100. In the PCB, the rigid portion R and the flexible portion F exhibit relative properties. Thus, the laminate 100 including the rigid insulating layer corresponds to the rigid portion R, and the flexible insulating layer 200 located on an outer side of the laminate 100 corresponds to the flexible portion F. The rigid portion R has a larger thickness than the flexible portion F.

A circuit may be formed on one or both surfaces of each of the plurality of insulating layers of the laminate 100, and a circuit may be formed on one or both surfaces of the flexible insulating layer 200. The circuit of the flexible insulating layer 200 may be electrically connected to the connection terminal 210. The circuit of the flexible insulating layer 200 may include a plurality of straight circuit lines extending in a longitudinal direction of the flexible insulating layer 200.

The first antenna A1 may be formed on one surface of the laminate 100 to receive or transmit signals. The first antenna A1 may include a patch antenna or may include a plurality of patch antennas to form an antenna array. The antenna array is shown in FIG. 5(b). The patch antenna may have a rectangular shape, as shown in FIG. 5(b), but the configuration is not limited thereto. The first antenna A1 may include a dipole antenna, a monopole antenna, and the like as well as the patch antenna.

The PCB according to the example may further include a second antenna A2 and an additional antenna A3.

The second antenna A2 is formed in the laminate 100 to vertically correspond to the first antenna A1. Here, the phrase "vertically correspond to" means that a virtual line extending from any point of the first antenna A1 in the thickness direction of the laminate 100 can reach the second antenna A2. That is, the first antenna A1 and the second antenna A2 may at least partially overlap each other vertically. The second antenna A2 may be of the same type as the first antenna A1. For example, the first antenna A1 and the second antenna A2, both of which are patch antennas, may form antenna arrays. In this case, the whole antenna array of the first antenna A1 may vertically correspond to the whole antenna array of the second antenna A2.

At least some of the plurality of insulating layers may be disposed between the first antenna A1 and the second antenna A2. That is, the first antenna A1 may be formed on one surface of the outermost layer among the plurality of insulating layers, and the second antenna A2 may be formed on one surface of a layer other than the outermost layer among the plurality of insulating layers. The first antenna A1 and the second antenna A2 may be directly connected to each other through a via. However, when the first antenna A1 and the second antenna A2 are not directly connected to each other but an insulating layer(s) between the first antenna A1 and the second antenna A2 is a dielectric, an electrical interaction may occur between the first antenna A1 and the second antenna A2.

Third to Nth antennas may be further formed between the first antenna A1 and the second antenna A2. For example, antennas (the third to Nth antennas) corresponding to the first antenna A1 and the second antenna A2 may be formed on one surface of each of the insulating layers disposed between the first antenna A1 and the second antenna A2. Also, the second to Nth antennas are removable, and the first antenna A1 may function alone.

The additional antenna A3 may be formed inside the laminate 100 to transmit or receive signals different from those of the first antenna A1. The additional antenna A3 may be of a different type from the first antenna A1. For example, the first antenna A1 may be a patch antenna, and the additional antenna A3 may be a monopole antenna or a dipole antenna. The additional antenna A3 may be used to process various signals in one PCB.

The package according to the example includes a PCB and an electronic element mounted on the PCB. The PCB is the same as the PCB according to the example, including the laminate 100 in which the rigid insulating layer is included, the flexible insulating layer 200, and the first antenna A1, and thus redundant description thereof will be omitted.

The electronic element may process a signal received from the first antenna A1 or a signal to be transmitted to the first antenna A1 and may include various components such as an active element, a passive element, an integrated circuit (IC), and the like. The electronic element may include various types of elements to form an electronic element module. For example, the electronic element may include an integrated circuit (IC) E1 such as a radio frequency IC (RFIC) and a passive element E2 such as a capacitor. The IC E1 may be provided with a plurality of ICs, and the passive element E2 may be provided with a plurality of passive elements.

The electronic element may be mounted on the PCB using a conductive member CM, and the conductive member CM may be a solder member containing a low melting point metal such as tin. A pad is formed on the electronic element, and a mounting pad P (see FIGS. 6-9) may also formed on the PCB. Then, the pad of the electronic element and the mounting pad P of the PCB may be bonded to each other using the conductive member CM.

In the package according to this example, the electronic element may be molded with a molding material M. The molding material M may include a resin and, in detail, may be an epoxy molding compound (EMC).

When the package is coupled to an external board B (e.g., a main board), the flexible insulating layer 200 may be extended and bent toward the external board B, and the connection terminal 210 of the flexible insulating layer 200 is bonded to a terminal T of the external board B. Thus, the package may be electrically connected to the external board B.

When the first antenna A1 receives a signal, the received signal may be delivered to the electronic element via the circuit of the laminate 100, and the signal processed by the electronic element may be delivered to the external board B via the circuit of the flexible insulating layer 200. When the first antenna A1 transmits a signal, the signal may be delivered from the external board B to the electronic element via the circuit of the flexible insulating layer 200, and then the signal processed by the electronic element may be delivered to the first antenna A1 through the circuit of the laminate 100.

According to an example, compared to a case in which a rigid board with an antenna formed therein and a flexible board are separately produced and bonded to each other through soldering, a signal transmission path may be shortened, and the risk of signal loss occurring at soldering joints may be eliminated. Also, these effects may be similarly exerted with respect to the additional antenna A3.

Figure 2:
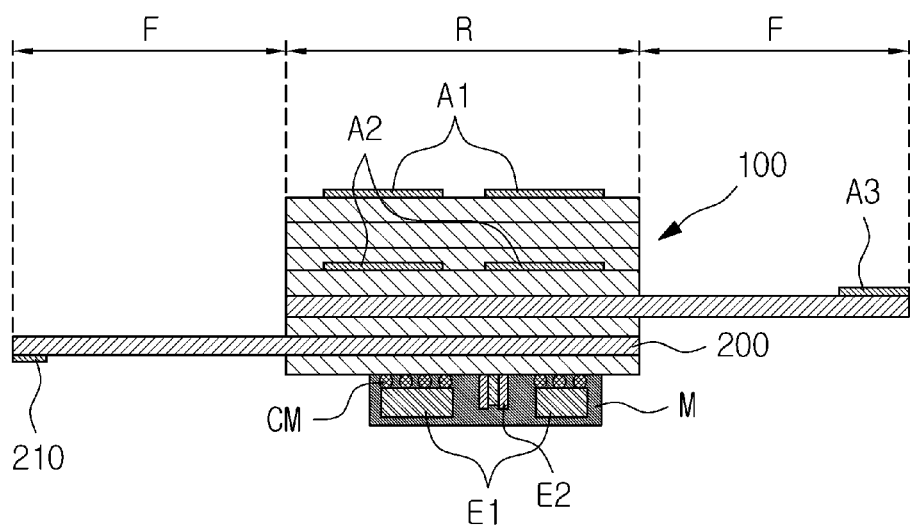
FIGS. 2 and 3 are diagrams showing a printed circuit board and a package including the same according to an example.
Figure 3:
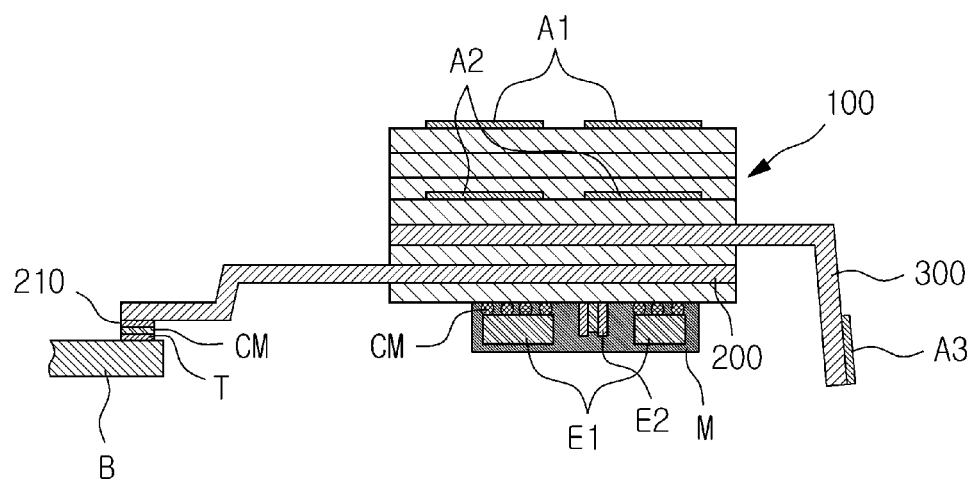

FIGS. 2 and 3 are diagrams showing a PCB and a package including the same according to an example.

The PCB includes a rigid portion R and a flexible portion F and is a rigid flexible board in which the rigid portion R and the flexible portion F are integrally formed. The PCB is distinguished from a board with a rigid board and a flexible board separately manufactured and then combined with each other through soldering bonding or the like.

Referring to FIGS. 2 and 3, the PCB a laminate 100, a flexible insulating layer 200, a second flexible insulating layer 300, and a first antenna A1.

The laminate 100 is formed by vertically stacking a plurality of insulating layers. The plurality of insulating layers includes a rigid insulating layer. All of the insulating layers may be the rigid insulating layers. Alternatively, some of the insulating layers may be the rigid insulating layers, and the other layers may be insulating layers that are more bendable than the rigid insulating layers.

The rigid insulating layer may be formed of an insulating material with a relatively low bendability and may include an epoxy resin and/or an imidazole resin. The rigid insulating layer may include a fiber reinforcing material such as glass fiber and may be a pre-preg, which is an epoxy resin containing the fiber reinforcing material. The rigid insulating layer may contain inorganic fillers.

When some of the insulating layers constituting the laminate 100 are rigid insulating layers and the other layers are insulating layers having a higher bendability than the rigid insulating layers, the insulating layers with a higher bendability than the rigid insulating layers may include at least one of PI, LCP, PTFE, Teflon, PFA, PPS, PPE, and PPO. The insulating layers having a higher bendability than the rigid insulating layers may have a Df of 0.004 or less.

The flexible insulating layer 200 may be formed of an insulating material that is more bendable and flexible than the rigid insulating layer and may include at least one of PI, LCP, PTFE, Teflon, PFA, PPS, PPE, and PPO. The Df of the flexible insulating layer 200 may be less than or equal to 0.002, which is lower than the Df of the plurality of insulating layers constituting the laminate 100.

The flexible insulating layer 200 may have a partial region in vertical contact with at least one of the plurality of insulating layers and a remaining region located on an outer side of the laminate 100. The partial region of the flexible insulating layer 200 may be located inside the laminate 100 and may be brought into vertical contact with two of the plurality of insulating layers. That is, the flexible insulating layer 200 may be interposed between the two insulating layers. A layer in contact with the flexible insulating layer 200 among the plurality of insulating layers may be a rigid insulating layer, but the configuration is not limited thereto. The flexible insulating layer 200 may be stacked on the outermost surface of the laminate 100. In this case, the flexible insulating layer 200 may be in vertical contact with one of the plurality of insulating layers. The flexible insulating layer 200 may be understood by referencing FIG. 7.

A connection terminal 210 may be formed at an end of the flexible insulating layer 200 and, in particular, at an end located on an outer side of the laminate 100. The connection terminal 210 may be connected to an external board B. The connection terminal 210 may be connected to a terminal T of the external board B. The connection terminal 210 of the flexible insulating layer 200 and the terminal T of the external board B may be bonded to each other using a conductive member CM such as solder. The connection terminal 210 may be buried in the flexible insulating layer 200 or may protrude from the flexible insulating layer 200.

Like the flexible insulating layer 200, the second flexible insulating layer 300 may be formed of an insulating material that is more bendable and flexible than the rigid insulating layer and may include at least one of PI, LCP, PTFE, Teflon, PFA, PPS, PPE, and PPO. The second flexible insulating layer 300 may be formed of the same insulating material as the flexible insulating layer 200. The second flexible insulating layer 300 may have a Df of 0.002 or less.

The second flexible insulating layer 300 has a partial region located inside the laminate 100 and a remaining region located on an outer side of the laminate 100. Since the partial region of the second flexible insulating layer 300 is located inside the laminate 100, the second flexible insulating layer 300 may be in vertical contact with the plurality of insulating layers constituting the laminate 100, and a layer in contact with the second flexible insulating layer 300 among the plurality of insulating layers may be a rigid insulating layer. However, the configuration is not limited thereto.

The flexible insulating layer 200 and the second flexible insulating layer 300 may be located in different layers in the laminate 100. The flexible insulating layer 200 and the second flexible insulating layer 300 are vertically spaced apart from each other, and at least one of the plurality of insulating layers may be interposed between the flexible insulating layer 200 and the second flexible insulating layer 300. The interposed at least one layer may include a rigid insulating layer.

In FIGS. 2 and 3, the flexible insulating layer 200 and the second flexible insulating layer 300 located in the rigid portion R have the same length (transverse length in FIG. 2) as the laminate 100. However, unlike FIG. 2, the length of the flexible insulating layer 200 located in the rigid portion R and/or the length of the second flexible insulating layer 300 may be shorter than the length of the laminate 100. In this case, an end of the rigid portion R of the flexible insulating layer 200 and/or the second flexible insulating layer 300 may be located inside the laminate 100 without being exposed to a side surface of the laminate 100.

The flexible insulating layer 200 and the second flexible insulating layer 300 may extend outside the laminate 100 in different directions. As shown in FIG. 3, the flexible insulating layer 200 may extend to the left of the laminate 100, and the second flexible insulating layer 300 may extend to the right of the laminate 100.

The PCB according to this example, which is a rigid flexible board, includes the rigid portion R and the flexible portion F. The rigid portion R includes the laminate 100, in which the rigid insulating layer is included, the flexible insulating layer 200, and the second flexible insulating layer 300, and the flexible portion F includes the flexible insulating layer 200 and the second flexible insulating layer 300 and does not include the rigid insulating layer. Even when an insulating layer having a higher bendability than the rigid insulating layer is included in the laminate 100 or a partial region of the flexible insulating layer 200 and a partial region of the second flexible insulating layer 300 are included in the laminate 100, the bendability of the laminate 100 is reduced because the rigid insulating layer is included in the laminate 100. In the PCB, the rigid portion R and the flexible portion F exhibit relative properties. Thus, the laminate 100 including the rigid insulating layer corresponds to the rigid portion R, and the flexible insulating layer 200 and the second flexible insulating layer 300 located on an outer side of the laminate 100 correspond to the flexible portion F. The rigid portion R has a larger thickness than the flexible portion F.

A circuit may be formed on one or both surfaces of each of the plurality of insulating layers of the laminate 100, and a circuit may be formed on one or both surfaces of the flexible insulating layer 200. In particular, the circuit of the flexible insulating layer 200 may be electrically connected to the connection terminal 210. The circuit of the flexible insulating layer 200 may include a plurality of straight circuit lines extending in a longitudinal direction of the flexible insulating layer 200. Also, a circuit may be formed on one or both surfaces of the second flexible insulating layer 300, and the circuit of the second flexible insulating layer 300 may include a plurality of straight circuit lines extending in a longitudinal direction of the second flexible insulating layer 300.

The first antenna A1 may be formed on one surface of the laminate 100 to receive or transmit signals. The first antenna A1 may include a patch antenna or may include a plurality of patch antennas to form an antenna array. The antenna array is shown in FIG. 5(b). The patch antenna may have a rectangular shape, as shown in FIG. 5(b), but the configuration is not limited thereto. The first antenna A1 may include a dipole antenna, a monopole antenna, and the like as well as the patch antenna.

The PCB may further include a second antenna A2 and an additional antenna A3.

The second antenna A2 is formed in the laminate 100 to vertically correspond to the first antenna A1. Here, the phrase "vertically correspond to" means that a virtual line extending from any point of the first antenna A1 in the thickness direction of the laminate 100 can reach the second antenna A2. That is, the first antenna A1 and the second antenna A2 may at least partially overlap each other vertically. The second antenna A2 may be of the same type as the first antenna A1. For example, the first antenna A1 and the second antenna A2, both of which are patch antennas, may form an antenna array. In this case, the whole antenna array of the first antenna A1 may vertically correspond to the whole antenna array of the second antenna A2.

At least some of the plurality of insulating layers may be disposed between the first antenna A1 and the second antenna A2. The first antenna A1 may be formed on one surface of the outermost layer among the plurality of insulating layers, and the second antenna A2 may be formed on one surface of a layer other than the outermost layer among the plurality of insulating layers. The first antenna A1 and the second antenna A2 may be directly connected to each other through a via. However, when the first antenna A1 and the second antenna A2 are not directly connected to each other but an insulating layer(s) between the first antenna A1 and the second antenna A2 is a dielectric, an electrical interaction may occur between the first antenna A1 and the second antenna A2.

Third to Nth antennas may be further formed between the first antenna A1 and the second antenna A2. For example, antennas (the third to Nth antennas) corresponding to the first antenna A1 and the second antenna A2 may be formed on one surface of each of the insulating layers disposed between the first antenna A1 and the second antenna A2. Also, the second to Nth antennas are removable, and the first antenna A1 may function alone.

The additional antenna A3 may be formed at one end of the second flexible insulating layer 300 and, in particular, at one end located outside the laminate 100 to transmit or receive signals different from those of the first antenna A1. The additional antenna A3 may protrude from the second flexible insulating layer 300. The additional antenna A3 may be of a different type from the first antenna A1. For example, the first antenna A1 may be a patch antenna, and the additional antenna A3 may be a monopole antenna or a dipole antenna. The additional antenna A3 may be used to process various signals in one PCB.

The package according to the example includes a PCB and an electronic element mounted on the PCB. The PCB is the same as the PCB according to the example, including the laminate 100 in which the rigid insulating layer is included, the flexible insulating layer 200, the second flexible insulating layer 300, and the first antenna A1, and thus redundant description thereof will be omitted.

The electronic element may process a signal received from the first antenna A1 or a signal to be transmitted to the first antenna A1 and may include various components such as an active element, a passive element, an IC, and the like. The electronic element may include various types of elements to form an electronic element module. For example, the electronic element may include an IC E1 such as an RFIC and a passive element E2 such as a capacitor. The IC E1 may be provided with a plurality of ICs, and the E2 may be provided with a plurality of passive elements.

The electronic element may be mounted on the PCB using a conductive member CM, and the conductive member CM may be a solder member containing a low melting point metal such as tin. A pad is formed on the electronic element, and a mounting pad P (see FIGS. 6-9) may also formed on the PCB. The pad of the electronic element and the mounting pad P of the PCB may be bonded to each other using the conductive member CM.

In the package, the electronic element may be molded with a molding material M. The molding material M may include a resin and, in detail, may be an EMC.

Referring to FIG. 3, the flexible insulating layer 200 has the connection terminal 210 and extends from the laminate 100 to one side (to the left), and a second insulating layer has the additional antenna A3 and extends from the laminate 100 to the other side (to the right). The flexible insulating layer 200 may be extended and bent toward the external board B (e.g., a main board), and the connection terminal 210 of the flexible insulating layer 200 is bonded to the terminal T of the external board B. Thus, the package may be electrically connected to the external board B. Also, the second flexible insulating layer 300 may be bent to place the additional antenna A3 in a specific position. The additional antenna A3 may be located close to a housing or may be coupled to the housing.

When the first antenna A1 receives a signal, the received signal may be delivered to the electronic element via the circuit of the laminate 100, and the signal processed by the electronic element may be delivered to the external board B via the circuit of the flexible insulating layer 200. When the first antenna A1 transmits a signal, the signal may be delivered from the external board B to the electronic element via the circuit of the flexible insulating layer 200, and then the signal processed by the electronic element may be delivered to the first antenna A1 through the circuit of the laminate 100.

According to this example, compared to a case in which a rigid board with an antenna formed therein and a flexible board are separately produced and bonded to each other through soldering, a signal transmission path may be shortened, and the risk of signal loss occurring at soldering joints may be eliminated. Also, these effects may be similarly exerted with respect to the additional antenna A3.

The first antenna A1 and the additional antenna A3 may be disposed in different directions, and thus the first antenna A1 and the additional antenna A3 may transmit or receive different signals in different directions.

Figure 4:
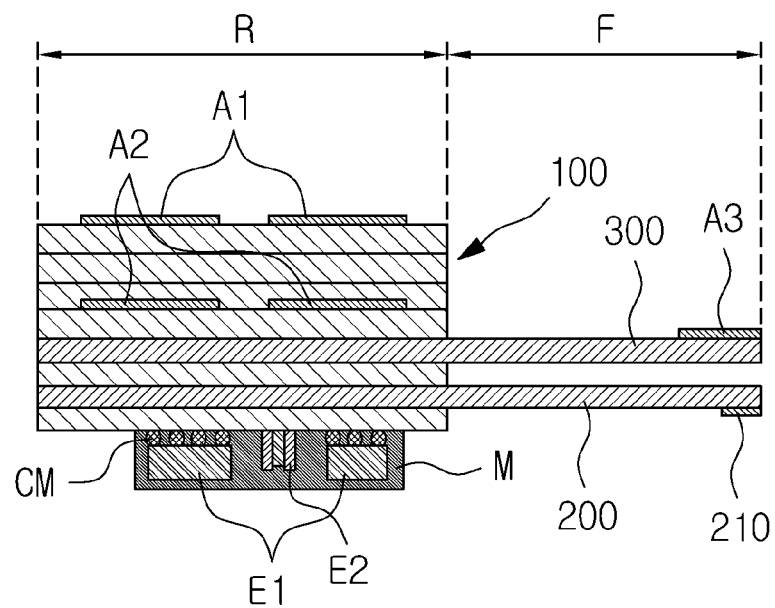
FIG. 4 is a diagram showing a printed circuit board and a package including the same according to an example.

FIG. 4 is a diagram showing a PCB and a package including the same according to an example.

Referring to FIG. 4, the PCB and the package including the same are similar to the PCB and the package including the same illustrated in FIGS. 2 and 3. However, a flexible insulating layer 200 and a second flexible insulating layer 300 extend outside a laminate 100 in the same direction. Accordingly, the directions in which the flexible insulating layer 200 and the second flexible insulating layer 300 extend may vary as needed. Redundant description thereof will be omitted.

Figure 5A:
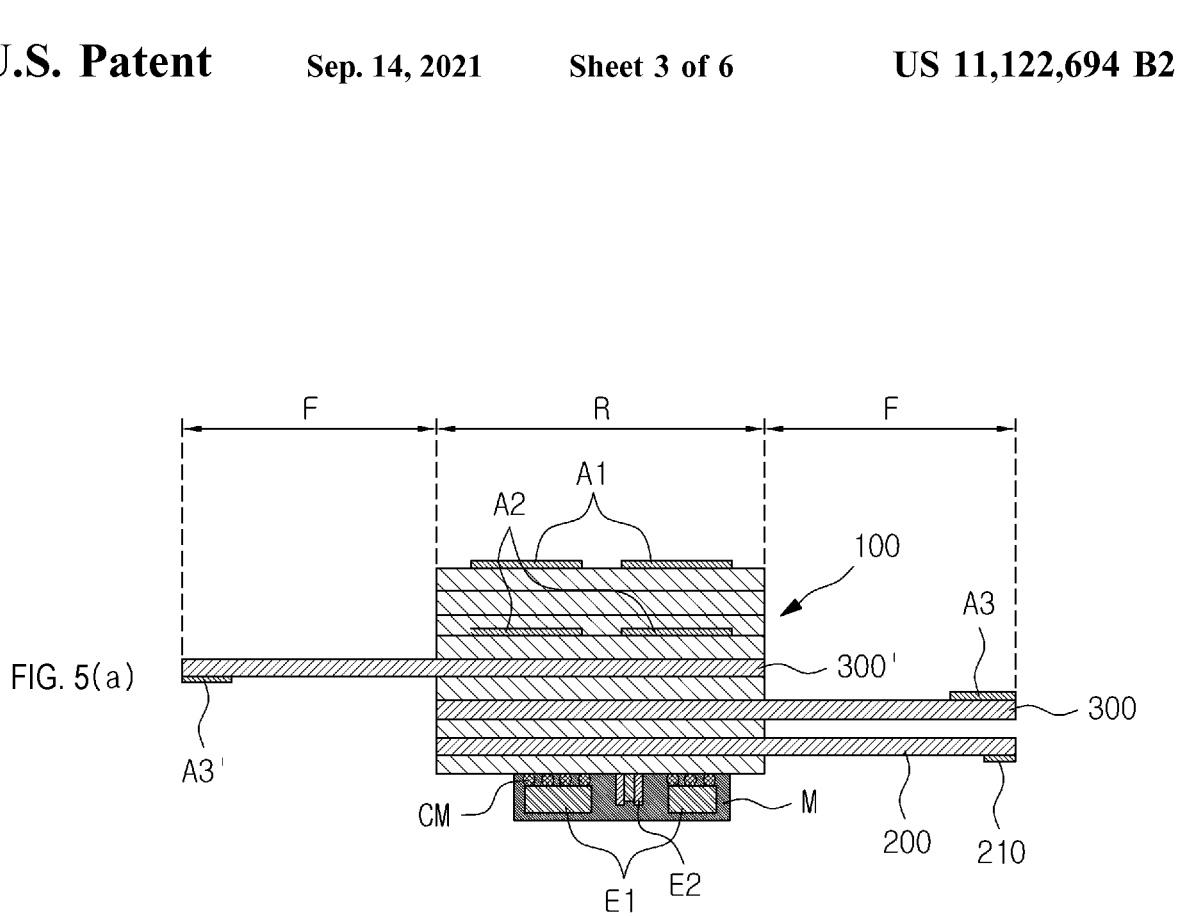
FIGS. 5(a) and 5(b) are diagrams showing a printed circuit board and a package including the same according to an example.
Figure 5B:
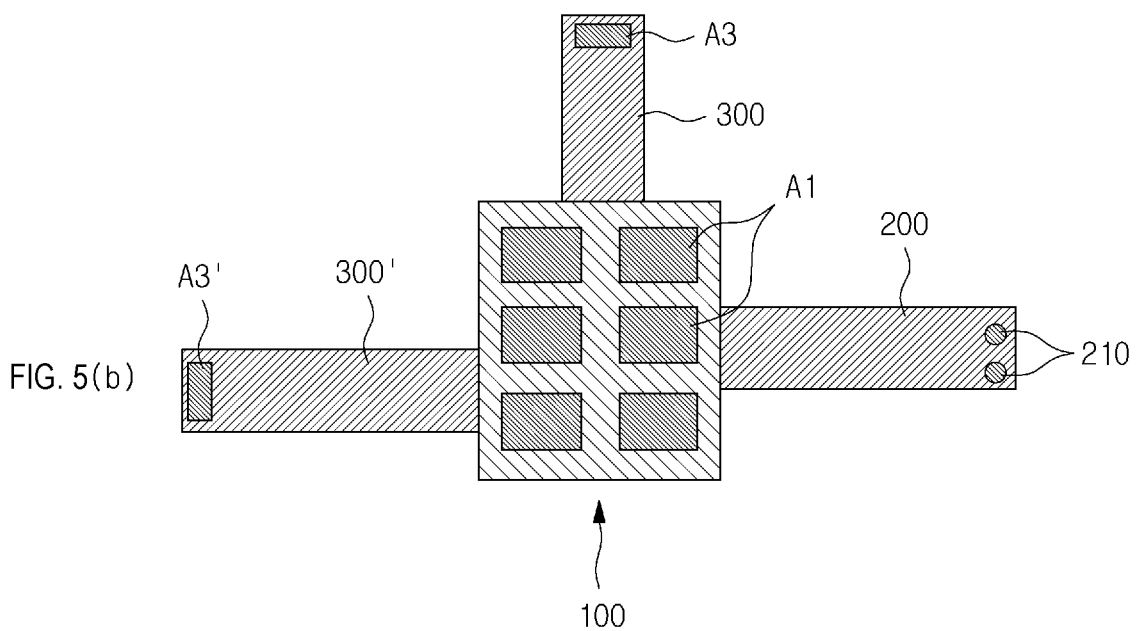

FIGS. 5(a) and 5(b) are diagrams showing a PCB and a package including the same according to an example.

Referring to FIG. 5(a), the PCB and the package including the same are similar to the PCB and the package including the same illustrated in FIGS. 2 and 3. However, a plurality of second flexible insulating layers 300 and 300' are formed. The plurality of second flexible insulating layers 300 and 300' may be located in different layers of the laminate 100. The plurality of second flexible insulating layers 300 and 300' may be vertically spaced apart from each other in the laminate 100, and an insulating layer may be interposed between the plurality of second flexible insulating layers 300 and 300'. The second flexible insulating layers 300 and 300' may have additional antennas A3 and A3', respectively. For the second flexible insulating layers 300 and 300', any one additional antenna A3 may protrude upward, and the other additional antenna A3' may protrude downward.

In FIG. 5(a), the second flexible insulating layer 300' extending to the left may be bent upward so that the additional antenna A3' faces toward the outside, and the second flexible insulating layer 300 extending to the right may be bent downward so that the additional antenna A3 faces toward the outside.

Referring to FIG. 5(b), the second flexible insulating layers 300 and 300' may extend outside the laminate 100 in different directions. In this case, the plurality of additional antennas A3 and A3' may transmit or receive signals in different directions. Here, the flexible insulating layer 200 having the connection terminal 210 may extend outside the laminate 100 in a direction different from those of the second flexible insulating layers 300 and 300'.

Only two second flexible insulating layers 300 and 300' are shown in FIGS. 5(a) and 5(b), but the configuration is not limited thereto. Thus, the PCB may include three or more second flexible insulating layers.

Figure 6:
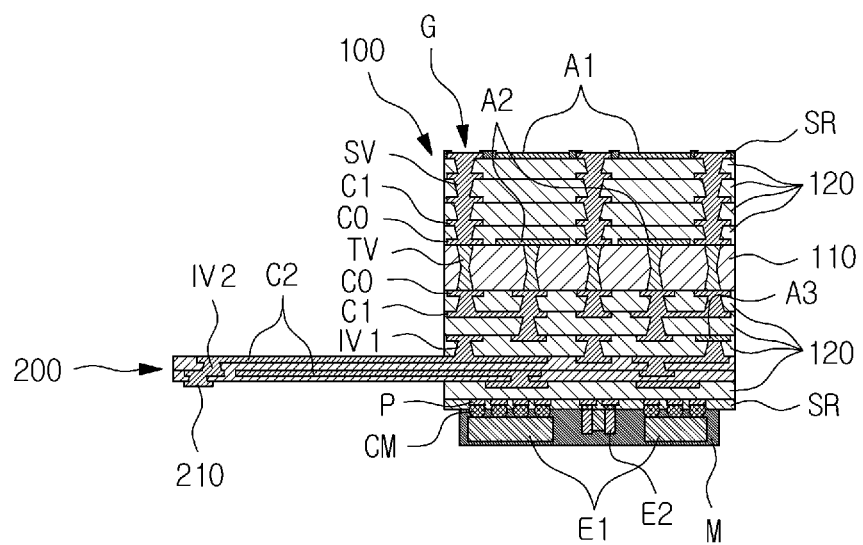
FIG. 6 is a diagram showing a printed circuit board and a package including the same according to an example.

FIG. 6 is a diagram showing a PCB and a package including the same according to an example.

The PCB includes a rigid portion R and a flexible portion F and is a rigid flexible board in which the rigid portion R and the flexible portion F are integrally formed. The PCB is distinguished from a board with a rigid board and a flexible board separately manufactured and then combined with each other through soldering bonding or the like.

Referring to FIG. 6, the PCB may include a laminate 100, a flexible insulating layer 200, and a first antenna A1.

The laminate 100 is formed by vertically stacking a plurality of insulating layers. The plurality of insulating layers includes a rigid insulating layer. All of the insulating layers may be the rigid insulating layers.

The rigid insulating layers included in the plurality of insulating layers may include a first rigid insulating layer 110 and a second rigid insulating layer 120. Here, the first rigid insulating layer 110 may have a larger thickness than the second rigid insulating layer 120, and the second rigid insulating layer 120 may be located on both sides of the first rigid insulating layer 110.

The first rigid insulating layer 110 may be formed of an insulating material with a low bendability and may include an epoxy resin and/or an imidazole resin. The first rigid insulating layer 110 may include a fiber reinforcing material such as glass fiber and may be a pre-preg, which is an epoxy resin containing the fiber reinforcing material. The first rigid insulating layer 110 may contain inorganic fillers. The first rigid insulating layer 110 is a single layer and may be located in approximately the center layer of the laminate 100 and also may be called a core layer.

The second rigid insulating layer 120 may be formed of an insulating material with a low bendability and may include an epoxy resin and/or an imidazole resin. The second rigid insulating layer 120 may include a fiber reinforcing material such as glass fiber and may be a pre-preg, which is an epoxy resin containing the fiber reinforcing material. The second rigid insulating layer 120 may contain inorganic fillers. The second rigid insulating layer 120 may be formed of the same insulating material as or a different insulating material from the first rigid insulating layer 110. The second rigid insulating layer 120 may have a smaller thickness than the first rigid insulating layer 110. Also, the second rigid insulating layer 120 may be provided with a plurality of second rigid insulating layers 120, and the same or a different number of second rigid insulating layers 120 may be stacked on both surfaces of the first rigid insulating layer 110.

A circuit may be formed in each of the plurality of insulating layers constituting the laminate 100. Referring to FIG. 6, a circuit C0 may have portions formed on both surfaces of the first rigid insulating layer 110, and a through-via TV for electrically connecting the portions of the circuit C0 formed on both surfaces may be formed through the first rigid insulating layer 110. A circuit C1 may have portions formed on surfaces of the second rigid insulating layers 120. The circuit C1 may be formed between the first rigid insulating layer 110 and an electronic element mounting surface, and at least a portion of the circuit C1 may be a feeding line. The circuit C1 may have portions located in different layers and electrically connected through an inner via IV1. A portion of the circuit C1 in the laminate 100 may be a mounting pad P.

The flexible insulating layer 200 may be formed of an insulating material that is more bendable and flexible than the rigid insulating layer and may include at least one of PI, LCP, PTFE, Teflon, PFA, PPS, PPE, and PPO. The Df of the flexible insulating layer 200 may be less than or equal to 0.002, which is lower than the Df of the plurality of insulating layers constituting the laminate 100.

The flexible insulating layer 200 may have a partial region in vertical contact with the second rigid insulating layers 120 and a remaining region located on an outer side of the laminate 100. The partial region of the flexible insulating layer 200 may be located inside the laminate 100 and may be brought into vertical contact with two of the plurality of second rigid insulating layers 120. The flexible insulating layer 200 may be interposed between the two second rigid insulating layers 120.

The flexible insulating layer 200 may be composed of a plurality of layers. In this case, the outermost layers among the plurality of layers of the flexible insulating layer 200 may be in vertical contact with the second rigid insulating layers 120.

In FIG. 6, the flexible insulating layer 200 located in the rigid portion R has the same length (transverse length in FIG. 6) as the laminate 100. However, unlike FIG. 6, the length of the flexible insulating layer 200 located in the rigid portion R may be shorter than the length of the laminate 100. In this case, an end of the rigid portion R of the flexible insulating layer 200 may be located inside the laminate 100 without being exposed to a side surface of the laminate 100.

A connection terminal 210 may be formed at an end of the flexible insulating layer 200 and, in particular, at an end located on an outer side of the laminate 100. The connection terminal 210 may be connected to an external board B (see FIG. 3). The connection terminal 210 may be connected to a terminal T of the external board B. The connection terminal 210 of the flexible insulating layer 200 and the terminal T of the external board B may be bonded to each other using a conductive member CM such as solder. The connection terminal 210 may be buried in the flexible insulating layer 200 or may protrude from the flexible insulating layer 200.

A circuit C2 may be formed in the flexible insulating layer 200. The circuit C2 of the flexible insulating layer 200 may be electrically connected to the connection terminal 210. The connection terminal 210 may be a portion of the circuit C2. The circuit C2 of the flexible insulating layer 200 may include a plurality of straight circuit lines extending in a longitudinal direction of the flexible insulating layer 200. When the flexible insulating layer 200 is composed of a plurality of layers, the circuit C2 may be formed for each of the plurality of layers, and the circuits C2 located in different layers may be electrically connected to each other through an inner via IV2. The circuits C0 and C1 formed inside the laminate 100 and the circuit C2 formed in the flexible insulating layer 200 may be electrically connected to the inner via IV1. As such, all the circuits in the PCB including the laminate 100 and the flexible insulating layer 200 may be electrically connected to each other through an inner via as needed.

The PCB, which is a rigid flexible board, includes the rigid portion R and the flexible portion F. The rigid portion R includes the laminate 100 and the flexible insulating layer 200, and the flexible portion F includes the flexible insulating layer 200. Since the laminate 100 includes the first rigid insulating layer 110 and the second rigid insulating layer 120, the rigid portion R includes the first rigid insulating layer 110, the second rigid insulating layer 120, and the flexible insulating layer 200. The rigid portion R has a larger thickness than the flexible portion F.

The first antenna A1 may be formed on one surface of the laminate 100 to receive or transmit signals. The first antenna A1 may be formed on one surface of the outermost layer among the plurality of insulating layers and, in particular, on one surface of the second rigid insulating layer 120 located on the outermost layer.

The first antenna A1 and the flexible insulating layer 200 may be located on opposite sides with respect to the first rigid insulating layer 110. That is, when the first antenna A1 is located on an upper side of the first rigid insulating layer 110, the flexible insulating layer 200 may be located on a lower side of the first rigid insulating layer 110.

The first antenna A1 may include a patch antenna or may include a plurality of patch antennas to form an antenna array. The patch antenna may have a quadrangular shape, but the configuration is not limited thereto. The first antenna A1 may include a dipole antenna, a monopole antenna, and the like as well as the patch antenna.

Grounds G may be formed in the vicinity of the first antenna A1. In particular, the grounds G may be formed on insulating layers between the first rigid insulating layer 110 and the outermost second rigid insulating layer 120 on which the first antenna A1 is formed, and the grounds G located in different layers may be connected to each other through a stack via SV. The stack via SV is a via formed by substantially vertically stacking a plurality of vias.

The PCB may further include a second antenna A2, an additional antenna A3, and a solder resist layer SR.

The second antenna A2 is formed in the laminate 100 to vertically correspond to the first antenna A1. Here, the phrase "vertically correspond to" means that a virtual line extending from any point of the first antenna A1 in the thickness direction of the laminate 100 can reach the second antenna A2. That is, the first antenna A1 and the second antenna A2 may at least partially overlap each other vertically. The second antenna A2 may be of the same type as the first antenna A1. For example, the first antenna A1 and the second antenna A2, both of which are patch antennas, may form an antenna array. In this case, the whole antenna array of the first antenna A1 may vertically correspond to the whole antenna array of the second antenna A2.

The second antenna A2 may be formed on one surface of the first rigid insulating layer 110 (a surface facing the first antenna A1, i.e., an upper surface in FIG. 6). The second antenna A2 may be electrically connected to a through-via passing through the first rigid insulating layer 110.

A plurality of second rigid insulating layers 120 may be disposed between the first antenna A1 and the second antenna A2. The first antenna A1 and the second antenna A2 may be directly connected to each other through a via. However, when the first antenna A1 and the second antenna A2 are not directly connected to each other but an insulating layer(s) between the first antenna A1 and the second antenna A2 is a dielectric, an electrical interaction may occur between the first antenna A1 and the second antenna A2.

Third to Nth antennas may be further formed between the first antenna A1 and the second antenna A2. For example, antennas (the third to Nth antennas) corresponding to the first antenna A1 and the second antenna A2 may be formed on one surface of each of the second rigid insulating layers 120 disposed between the first antenna A1 and the second antenna A2. The second to Nth antennas are removable, and the first antenna A1 may function alone.

The additional antenna A3 may be formed inside the laminate 100 to transmit or receive signals different from those of the first antenna A1. The additional antenna A3 may be formed on one surface of the second rigid insulating layer 120 or on one surface of the flexible insulating layer 200 located in the laminate 100.

The additional antenna A3 may be of a different type from the first antenna A1. For example, the first antenna A1 may be a patch antenna, and the additional antenna A3 may be a monopole antenna or a dipole antenna. The additional antenna A3 may be used to process various signals in one PCB.

The solder resist layer SR may be stacked on both sides of the laminate 100, may be stacked on one surface of the laminate 100 to expose the grounds G and the first antenna A1, and may be stacked on the other side of the laminate 100 to expose the mounting pad P.

The package includes a PCB and an electronic element mounted on the PCB. The PCB may be the same as the PCB in FIG. 6, including the laminate 100 in which the rigid insulating layer is included, the flexible insulating layer 200, and the first antenna A1, and thus redundant description thereof will be omitted.

The electronic element may process a signal received from the first antenna A1 or a signal to be transmitted to the first antenna A1 and may include various components such as an active element, a passive element, an IC, and the like. The electronic element may include various types of elements to form an electronic element module. For example, the electronic element may include an IC E1 such as an RFIC and a passive element E2 such as a capacitor. The IC E1 may be provided with a plurality of ICs, and the passive element E2 may be provided with a plurality of passive elements.

The electronic element may be mounted on the PCB using a conductive member CM, and the conductive member CM may be a solder member containing a low melting point metal such as tin. A pad is formed on the electronic element, and a mounting pad P is also formed on the PCB. The pad of the electronic element and the mounting pad P of the PCB may be bonded to each other using the conductive member CM.

In the package, the electronic element may be molded with a molding material M. The molding material may include a resin and, in detail, may be an EMC.

When the package is coupled to an external board B (e.g., a main board), the flexible insulating layer 200 may be extended and bent toward the external board B, and the connection terminal 210 of the flexible insulating layer 200 is bonded to a terminal T of the external board B. Thus, the package may be electrically connected to the external board B.

When the first antenna A1 receives a signal, the received signal may be delivered to the electronic element via the circuits C0 and C1 of the laminate 100, and the signal processed by the electronic element may be delivered to the external board B via the circuit C2 of the flexible insulating layer 200. When the first antenna A1 transmits a signal, the signal may be delivered from the external board B to the electronic element via the circuit C2 of the flexible insulating layer 200, and then the signal processed by the electronic element may be delivered to the first antenna A1 through the circuits C0 and C1 of the laminate 100.

According to this example, compared to a case in which a rigid board with an antenna formed therein and a flexible board are separately produced and bonded to each other through soldering, a signal transmission path may be shortened, and the risk of signal loss occurring at soldering joints may be eliminated. Also, these effects may be similarly exerted with respect to the additional antenna A3.

Figure 7:
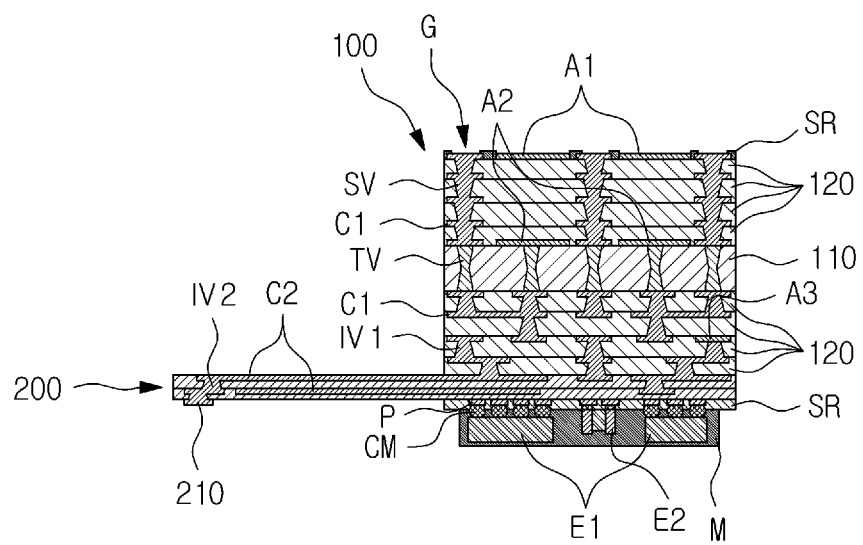
FIG. 7 is a diagram showing a printed circuit board and a package including the same according to an example.

FIG. 7 is a diagram showing a PCB and a package including the same according to an example.

Referring to FIG. 7, the PCB and the package including the same are similar to the example of FIG. 6. However, a flexible insulating layer 200 may be vertically bonded to an outer surface of a laminate 100. A first antenna A1 is formed on one surface of the laminate 100, and the flexible insulating layer 200 is stacked on the other surface of the laminate 100. Accordingly, only one surface of the flexible insulating layer 200 is in vertical contact with the laminate 100. In this case, a mounting pad P may be formed on one surface of the flexible insulating layer 200. A solder resist layer SR may be stacked on the other surface of the flexible insulating layer 200. That is, the flexible insulating layer 200 is in vertical contact with the solder resist layer SR. In this case, a signal path may be more shortened than that of the embodiment of FIGS. 5(a) and 5(b).

Figure 8:
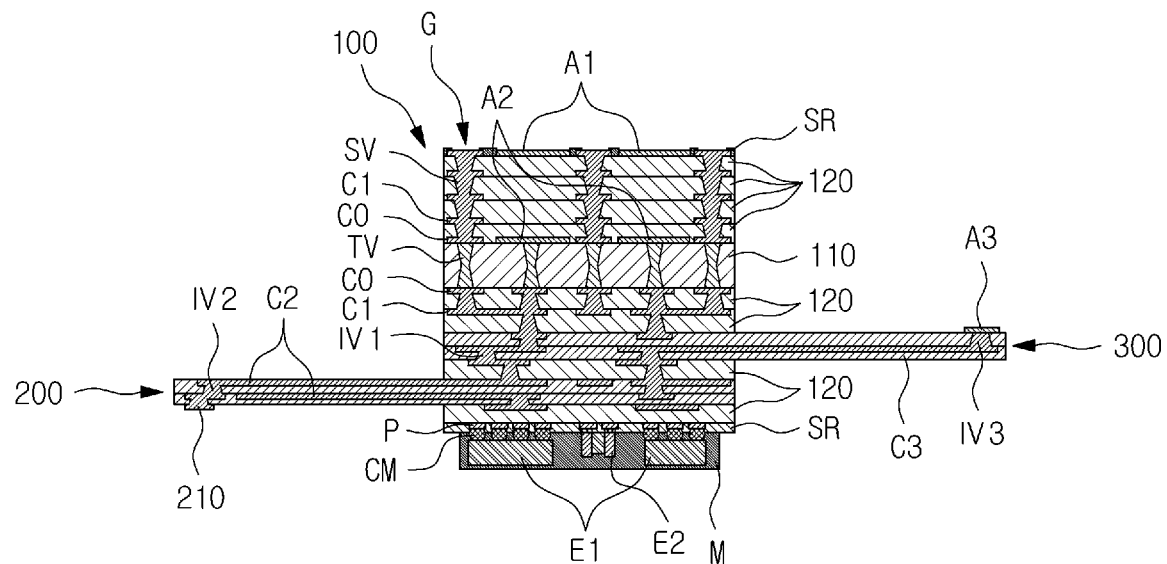
FIG. 8 is a diagram showing a printed circuit board and a package including the same according to an example.

FIG. 8 is a diagram showing a PCB and a package including the same according to an example.

The PCB includes a rigid portion R and a flexible portion F and is a rigid flexible board in which the rigid portion R and the flexible portion F are integrally formed. The PCB is distinguished from a board with a rigid board and a flexible board separately manufactured and then combined with each other through soldering bonding or the like.

Referring to FIG. 8, the PCB may include a laminate 100, a flexible insulating layer 200, a second flexible insulating layer 300, and a first antenna A1.

The laminate 100 is formed by vertically stacking a plurality of insulating layers. The plurality of insulating layers includes a rigid insulating layer. All of the insulating layers may be the rigid insulating layers.

The rigid insulating layers included in the plurality of insulating layers may include a first rigid insulating layer 110 and a second rigid insulating layer 120. The first rigid insulating layer 110 may have a larger thickness than the second rigid insulating layer 120, and the second rigid insulating layer 120 may be located on both sides of the first rigid insulating layer 110.

The first rigid insulating layer 110 may be formed of an insulating material with a low bendability and may include an epoxy resin and/or an imidazole resin. The first rigid insulating layer 110 may include a fiber reinforcing material such as glass fiber and may be a pre-preg, which is an epoxy resin containing the fiber reinforcing material. The first rigid insulating layer 110 may contain inorganic fillers. The first rigid insulating layer 110 is a single layer and may be located in almost the center layer of the laminate 100 and also may be called a core layer.

The second rigid insulating layer 120 may be formed of an insulating material with a low bendability and may include an epoxy resin and/or an imidazole resin. The second rigid insulating layer 120 may include a fiber reinforcing material such as glass fiber and may be a pre-preg, which is an epoxy resin containing the fiber reinforcing material. The second rigid insulating layer 120 may contain inorganic fillers. The second rigid insulating layer 120 may be formed of the same insulating material as or a different material from the first rigid insulating layer 110. The second rigid insulating layer 120 may have a smaller thickness than the first rigid insulating layer 110. The second rigid insulating layer 120 may be provided with a plurality of second rigid insulating layers, and the same or a different number of second rigid insulating layers 120 may be stacked on both surfaces of the first rigid insulating layer 110.

A circuit may be formed in each of the plurality of insulating layers constituting the laminate 100. Referring to FIG. 8, a circuit C0 may have portions formed on both surfaces of the first rigid insulating layer 110, and a through-via TV for electrically connecting the portions of the circuit C0 formed on both surfaces may be formed through the first rigid insulating layer 110. A circuit C1 may have portions formed on surfaces of the second rigid insulating layers 120. In particular, the circuit C1 may be formed between the first rigid insulating layer 110 and an electronic element mounting surface, and at least a portion of the circuit C1 may be a feeding line. The circuit C1 may have portions located in different layers and electrically connected through an inner via IV1. A portion of the circuit C1 in the laminate 100 may be a mounting pad P.

The flexible insulating layer 200 may be formed of an insulating material that is more bendable and flexible than the rigid insulating layer and may include at least one of PI, LCP, PTFE, Teflon, PFA, PPS, PPE, and PPO. The Df of the flexible insulating layer 200 may be less than or equal to 0.002, which is lower than the Df of the plurality of insulating layers constituting the laminate 100.

The flexible insulating layer 200 may have a partial region in vertical contact with the second rigid insulating layers 120 and a remaining region located on an outer side of the laminate 100. The partial region of the flexible insulating layer 200 may be located inside the laminate 100 and may be brought into vertical contact with two of the plurality of second rigid insulating layers 120. That is, the flexible insulating layer 200 may be interposed between the two second rigid insulating layers 120.

The flexible insulating layer 200 may be composed of a plurality of layers. In this case, the outermost layers among the plurality of layers of the flexible insulating layer 200 may be in vertical contact with the second rigid insulating layers 120.

In FIG. 8, the flexible insulating layer 200 located in the rigid portion R has the same length (transverse length in FIG. 8) as the laminate 100. However, unlike FIG. 8, the length of the flexible insulating layer 200 located in the rigid portion R may be shorter than the length of the laminate 100. In this case, an end of the rigid portion R of the flexible insulating layer 200 may be located inside the laminate 100 without being exposed to a side surface of the laminate 100.

A connection terminal 210 may be formed at an end of the flexible insulating layer 200 and, in particular, at an end located on an outer side of the laminate 100. The connection terminal 210 may be connected to an external board B (see FIG. 3). The connection terminal 210 may be connected to a terminal T of the external board B. The connection terminal 210 of the flexible insulating layer 200 and the terminal T of the external board B may be bonded to each other using a conductive member CM such as solder. The connection terminal 210 may be buried in the flexible insulating layer 200 or may protrude from the flexible insulating layer 200.

Like the flexible insulating layer 200, the second flexible insulating layer 300 may be formed of an insulating material that is more bendable and flexible than the rigid insulating layer and may include at least one of PI, LCP, PTFE, Teflon, PFA, PPS, PPE, and PPO. The second flexible insulating layer 300 may be formed of the same insulating material as the flexible insulating layer 200. The second flexible insulating layer 300 may have a Df of 0.002 or less.

The second flexible insulating layer 300 has a partial region located inside the laminate 100 and a remaining region located on an outer side of the laminate 100. Since the partial region of the second flexible insulating layer 300 is located inside the laminate 100, the partial region may be in vertical contact with at least one of the first rigid insulating layer 110, the second rigid insulating layer 120, and the flexible insulating layer 200. In FIG. 8, the second flexible insulating layer 300 may be interposed between the two second rigid insulating layers 120. The flexible insulating layer 200 may be composed of a plurality of layers.

The flexible insulating layer 200 and the second flexible insulating layer 300 may be located in different layers in the laminate 100. The flexible insulating layer 200 and the second flexible insulating layer 300 are vertically spaced apart from each other, and the second rigid insulating layer 120 may be interposed between the flexible insulating layer 200 and the second flexible insulating layer 300.

In FIG. 8, the flexible insulating layer 200 and the second flexible insulating layer 300 located in the rigid portion R have the same length (transverse length in FIG. 8) as the laminate 100. However, unlike FIG. 8, the length of the second flexible insulating layer 300 located in the rigid portion R may be shorter than the length of the laminate 100. In this case, an end of the rigid portion R of the second flexible insulating layer 300 may be located inside the laminate 100 without being exposed to a side surface of the laminate 100.

The flexible insulating layer 200 and the second flexible insulating layer 300 may extend outside the laminate 100 in the same or different directions. The second flexible insulating layer 300 may be provided with a plurality of second flexible insulating layers. The plurality of second flexible insulating layers 300 may be located in different layers in the laminate 100 and may extend outside the laminate 100 in different directions.

A circuit C2 may be formed in the flexible insulating layer 200. The circuit C2 of the flexible insulating layer 200 may be electrically connected to the connection terminal 210. The connection terminal 210 may be a portion of the circuit C2. The circuit C2 of the flexible insulating layer 200 may include a plurality of straight circuit lines extending in a longitudinal direction of the flexible insulating layer 200. When the flexible insulating layer 200 is composed of a plurality of layers, the circuit C2 may be formed for each of the plurality of layers, and the circuits C2 located in different layers may be electrically connected to each other through an inner via IV2. The circuit C1 formed inside the laminate 100 and the circuit C2 formed in the flexible insulating layer 200 may be electrically connected to the inner via IV1.

A circuit C3 may be formed in the second flexible insulating layer 300. The circuit C3 of the second flexible insulating layer 300 may include a plurality of straight circuit lines extending in a longitudinal direction of the second flexible insulating layer 300. When the second flexible insulating layer 300 is composed of a plurality of layers, the circuit C3 may be formed for each of the plurality of layers, and the circuits C3 located in different layers may be electrically connected to each other through an inner via IV3. The circuits C0, C1, and C2 formed inside the laminate 100 and the circuit C3 formed in the flexible insulating layer 200 may be electrically connected to the inner via IV1. As such, all the circuits in the PCB including the laminate 100 and the flexible insulating layer 200 may be electrically connected to each other through an inner via as needed.

The PCB, which is a rigid flexible board, includes the rigid portion R and the flexible portion F. The rigid portion R includes the laminate 100, the flexible insulating layer 200, and the second flexible insulating layer 300, and the flexible portion F includes the flexible insulating layer 200 and the second flexible insulating layer 300. Since the laminate 100 includes the first rigid insulating layer 110 and the second rigid insulating layer 120, the rigid portion R includes the first rigid insulating layer 110, the second rigid insulating layer 120, the flexible insulating layer 200, and the second flexible insulating layer 300. The rigid portion R has a larger thickness than the flexible portion F.

The first antenna A1 may be formed on one surface of the laminate 100 to receive or transmit signals. The first antenna A1 may be formed on one surface of the outermost layer among the plurality of insulating layers and, in particular, on one surface of the second rigid insulating layer 120 located on the outermost layer.

The first antenna A1 and the flexible insulating layer 200 may be located on opposite sides with respect to the first rigid insulating layer 110. That is, when the first antenna A1 is located on an upper side of the first rigid insulating layer 110, the flexible insulating layer 200 may be located on a lower side of the first rigid insulating layer 110.

The first antenna A1 may include a patch antenna or may include a plurality of patch antennas to form an antenna array. The patch antenna may have a quadrangular shape, but the present invention is not limited thereto. The first antenna A1 may include a dipole antenna, a monopole antenna, and the like as well as the patch antenna.

Grounds G may be formed in the vicinity of the first antenna A1. In particular, the grounds G may be formed on insulating layers between the first rigid insulating layer 110 and the outermost second rigid insulating layer 120 on which the first antenna A1 is formed, and the grounds G located in different layers may be connected to each other through a stack via SV. The stack via SV is a via formed by substantially vertically stacking a plurality of vias.

The PCB may further include a second antenna A2, an additional antenna A3, and a solder resist layer SR.

The second antenna A2 is formed in the laminate 100 to vertically correspond to the first antenna A1. Here, the phrase "vertically correspond to" means that a virtual line extending from any point of the first antenna A1 in the thickness direction of the laminate 100 can reach the second antenna A2. That is, the first antenna A1 and the second antenna A2 may at least partially overlap each other vertically. The second antenna A2 may be of the same type as the first antenna A1. For example, the first antenna A1 and the second antenna A2, both of which are patch antennas, may form an antenna array. In this case, the whole antenna array of the first antenna A1 may vertically correspond to the whole antenna array of the second antenna A2.

The second antenna A2 may be formed on one surface of the first rigid insulating layer 110 (a surface facing the first antenna A1, i.e., an upper surface in FIG. 8). The second antenna A2 may be electrically connected to a through-via passing through the first rigid insulating layer 110.

A plurality of second rigid insulating layers 120 may be disposed between the first antenna A1 and the second antenna A2. The first antenna A1 and the second antenna A2 may be directly connected to each other through a via. However, when the first antenna A1 and the second antenna A2 are not directly connected to each other but an insulating layer(s) between the first antenna A1 and the second antenna A2 is a dielectric, an electrical interaction may occur between the first antenna A1 and the second antenna A2.

Third to Nth antennas may be further formed between the first antenna A1 and the second antenna A2. For example, antennas (the third to Nth antennas) corresponding to the first antenna A1 and the second antenna A2 may be formed on one surface of each of the second rigid insulating layers 120 disposed between the first antenna A1 and the second antenna A2. The second to Nth antennas are removable, and the first antenna A1 may function alone.

The additional antenna A3 may be formed inside the laminate 100 to transmit or receive signals different from those of the first antenna A1. The additional antenna A3 may be formed on one surface of the second rigid insulating layer 120 or on one surface of the flexible insulating layer 200 located in the laminate 100.

The additional antenna A3 may be formed at one end of the second flexible insulating layer 300 and, in particular, at one end located outside the laminate 100 to transmit or receive signals different from those of the first antenna A1. The additional antenna A3 may protrude from the second flexible insulating layer 300. The additional antenna A3 may be of a different type from the first antenna A1. For example, the first antenna A1 may be a patch antenna, and the additional antenna A3 may be a monopole antenna or a dipole antenna. The additional antenna A3 may be used to process various signals in one PCB.

When the second flexible insulating layer 300 is provided with a plurality of second flexible insulating layers, each of the plurality of second flexible insulating layers 300 may have the additional antenna A3. The protruding directions of the additional antennas A3 to the second flexible insulating layers 300 may be different from each other, and the plurality of second flexible insulating layers 300 may be bent in different directions such that the additional antennas A3 are disposed to face the outside.

The solder resist layer SR may be stacked on both sides of the laminate 100. The solder resist layer SR may be stacked on one surface of the laminate 100 to expose the grounds G and the first antenna A1, and may be stacked on the other surface of the laminate 100 to expose the mounting pad P.

The package includes a PCB and an electronic element mounted on the PCB. The PCB may be the same as the PCB in FIG. 8, including the laminate 100 in which the rigid insulating layer is included, the flexible insulating layer 200, the second flexible insulating layer 300, and the first antenna A1, and thus redundant description thereof will be omitted.

The electronic element may process a signal received from the first antenna A1 or a signal to be transmitted to the first antenna A1 and may include various components such as an active element, a passive element, an IC, and the like. The electronic element may include various types of elements to form an electronic element module. For example, the electronic element may include an IC E1 such as an RFIC and a passive element E2 such as a capacitor. The IC E1 may be provided with a plurality of ICs, and the passive element E2 may be provided with a plurality of passive elements.

The electronic element may be mounted on the PCB using a conductive member CM, and the conductive member CM may be a solder member containing a low melting point metal such as tin. A pad is formed on the electronic element, and a mounting pad P is also formed on the PCB. The pad of the electronic element and the mounting pad P of the PCB may be bonded to each other using the conductive member CM.

In the package, the electronic element may be molded with a molding material M. The molding material may include a resin and, in detail, may be an EMC.

When the package is coupled to an external board B (e.g., a main board), the flexible insulating layer 200 may be extended and bent toward the external board B, and the connection terminal 210 of the flexible insulating layer 200 is bonded to a terminal T of the external board B. Thus, the package may be electrically connected to the external board B.

When the first antenna A1 receives a signal, the received signal may be delivered to the electronic element via the circuits C0 and C1 of the laminate 100, and the signal processed by the electronic element may be delivered to the external board B via the circuit C2 of the flexible insulating layer 200. When the first antenna A1 transmits a signal, the signal may be delivered from the external board B to the electronic element via the circuit C2 of the flexible insulating layer 200, and then the signal processed by the electronic element may be delivered to the first antenna A1 through the circuits C0 and C1 of the laminate 100.

According to this example, compared to a case in which a rigid board with an antenna formed therein and a flexible board are separately produced and bonded to each other through soldering, a signal transmission path may be shortened, and the risk of signal loss occurring at soldering joints may be eliminated. Also, these effects may be similarly exerted with respect to the additional antenna A3.

Figure 9:
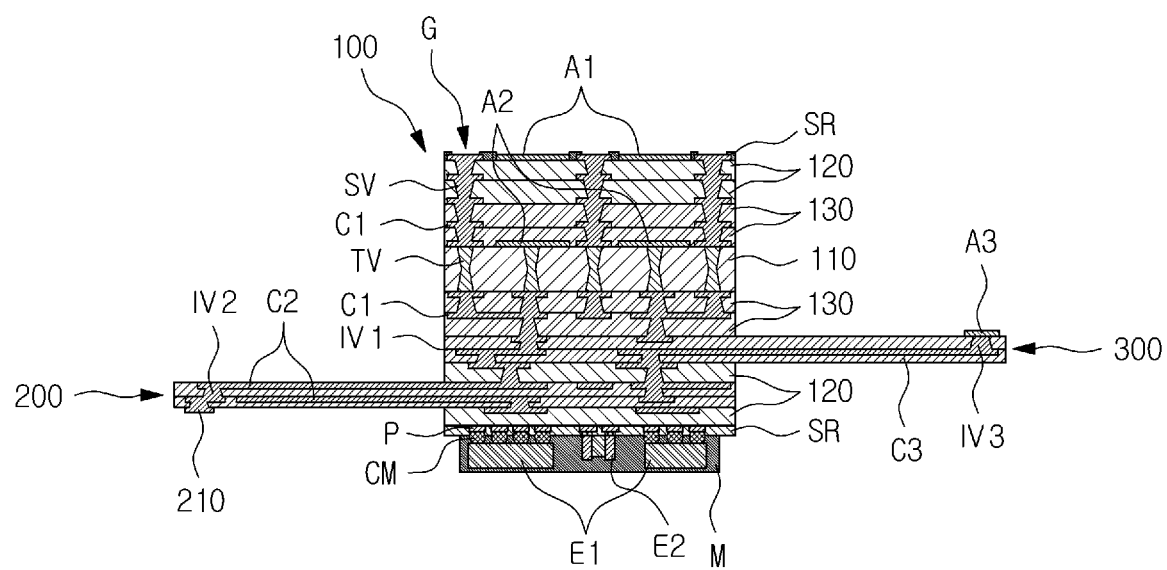
FIG. 9 is a diagram showing a printed circuit board and a package including the same according to an example.

FIG. 9 is a diagram showing a PCB and a package including the same according to an example.

In the PCB, a laminate 100 may include a plurality of insulating layers, and the plurality of insulating layers may include a rigid insulating layer and an insulating layer 130 that is more bendable and flexible than the rigid insulating layer (hereinafter, referred to as a flexible layer) and may further include a second flexible insulating layer 300. In particular, some of the plurality of insulating layers may be rigid insulating layers 110 and 120, and the other layers are the flexible layers 130.

Referring to FIG. 9, the laminate 100 includes a first rigid insulating layer 110, a second rigid insulating layer 120, and the flexible layer 130. The laminate 100 includes the first rigid insulating layer 110 and the flexible layer 130.

In both of two cases, the first rigid insulating layer 110 is a single layer, and may be located in substantially the center layer of the laminate 100. Other features are not different from those described in the previous examples. The second rigid insulating layer 120 may be stacked on both sides of a first insulating layer. Other features are not different from those described in the previous examples.

The flexible layer 130 may be stacked on both sides of the first rigid insulating layer 110. The flexible layer may include at least one of PI, LCP, PTFE, Teflon, PFA, PPS, PPE, and PPO. The flexible layer 130 may have a Df of 0.004 or less.

In the PCB, the rigid portion R and the flexible portion F exhibit relative properties. Thus, the laminate 100 is the rigid portion R, and the flexible insulating layer 200 and the second flexible insulating layer 300 located on an outer surface of the laminate 100 are the flexible portion F because the laminate 100 includes the rigid insulating layer despite including the flexible layer 130. The rigid portion R has a larger thickness than the flexible portion F.

Figure 10:
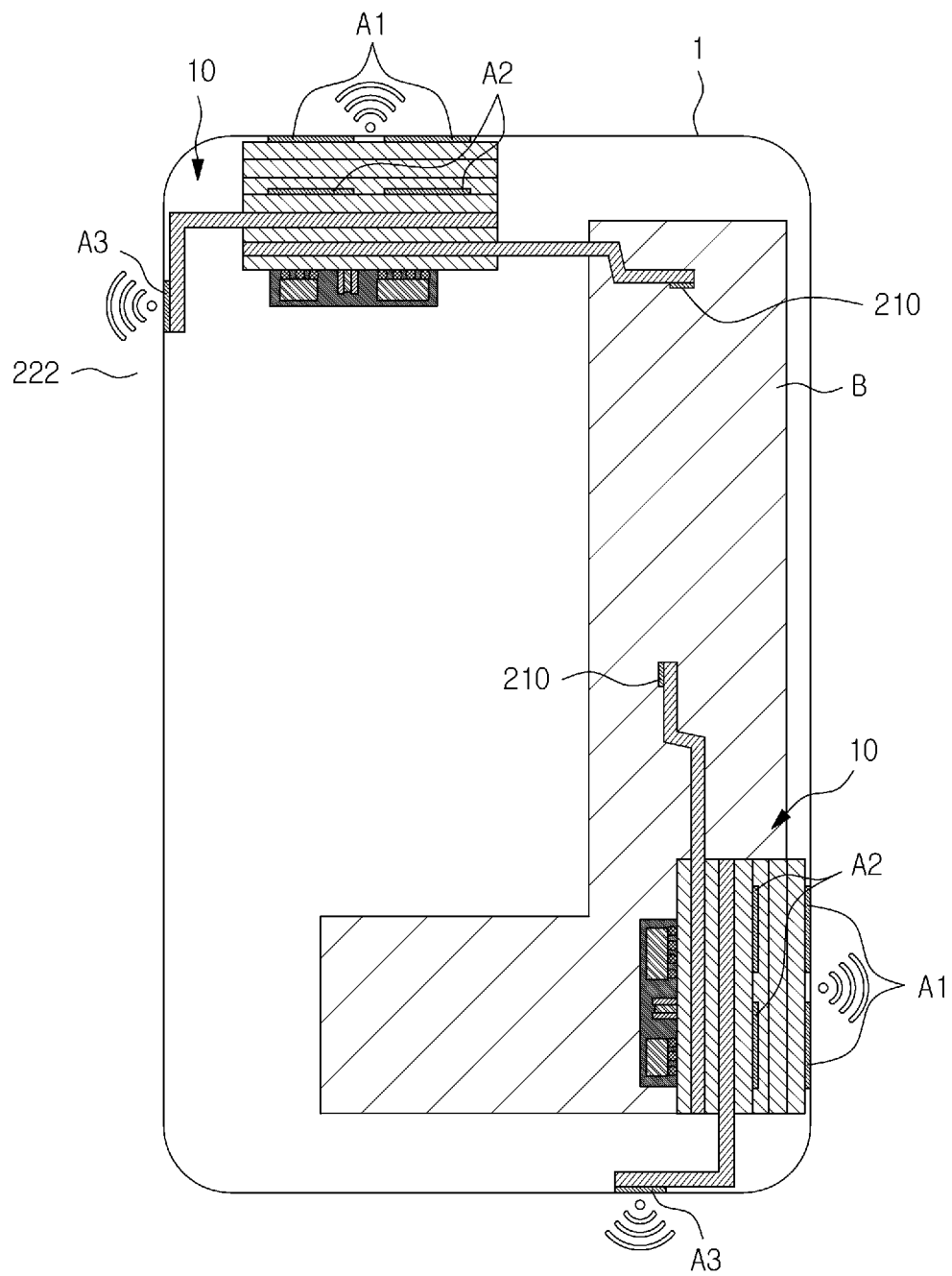
FIG. 10 is a diagram showing that an electronic element equipped with a package according to an example.

FIG. 10 is a diagram showing an electronic element 1 that is equipped with a package according to an example. As shown in FIG. 10, the PCB and the package 10 including the same may be installed in the electronic element 1. In particular, a first antenna A1 and an additional antenna A3 may be coupled to a housing to face the outside in the electronic element 1, and a flexible insulating layer may be bonded to a main board B. A plurality of packages, which are identical to the package 10, may be installed in the electronic element 1.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a laminate comprising stacked insulating layers including a rigid insulating layer;
   a first flexible insulating layer comprising a partial region that overlaps and is in contact with at least one of the insulating layers and a remaining region disposed outside of the laminate;
   a second flexible insulating layer disposed in the laminate, wherein the first flexible insulating layer and the second flexible insulating layer are on different planes and extend outside the laminate in different directions; and
   a first antenna disposed on a surface of the laminate.

2. The printed circuit board of claim 1, further comprising a second antenna disposed in the laminate and overlapping the first antenna.

3. The printed circuit board of claim 1, further comprising an additional antenna disposed in the laminate,
   wherein the additional antenna is of a different type from the first antenna.

4. The printed circuit board of claim 1, wherein the second flexible insulating layer comprises a partial region disposed inside the laminate and a remaining region disposed outside of the laminate.

5. The printed circuit board of claim 4, further comprising a circuit pattern disposed at an end of the remaining region of the first flexible insulating layer; and
   an additional antenna disposed at an end of the remaining region of the second flexible insulating layer.

6. The printed circuit board of claim 4, wherein the first flexible insulating layer and the second flexible insulating layer extend outside the laminate in a same direction.

7. The printed circuit board of claim 4, wherein the first flexible insulating layer and the second flexible insulating layer comprise a plurality of layers, respectively.

8. The printed circuit board of claim 1, wherein the rigid insulating layer comprises:
   a first rigid insulating layer; and a second rigid insulating layer disposed on both sides of the first rigid insulating layer, and the first rigid insulating layer is thicker than the second rigid insulating layer.

9. The printed circuit board of claim 8, wherein the first antenna and the first flexible insulating layer are disposed on opposite sides of the first rigid insulating layer.

10. The printed circuit board of claim 1, further comprising a solder resist layer stacked on at least one side of the laminate.

11. The printed circuit board of claim 10, wherein the first flexible insulating layer is in contact with the solder resist layer.

12. The printed circuit board of claim 1, wherein the first flexible insulating layer comprises one or both of an insulating layer comprising a liquid crystal polymer (LCP) and an insulating layer comprising a polyphenylene ether (PPE).

13. A printed circuit board comprising:

a laminate comprising stacked insulating layers including a rigid insulating layer;

a first flexible insulating layer comprising a partial region that overlaps and is in contact with at least one of the insulating layers and a remaining region disposed outside of the laminate;

a second flexible insulating layer comprising a partial region disposed inside the laminate and a remaining region disposed outside of the laminate; and a first antenna disposed on a surface of the laminate, wherein the first flexible insulating layer and the second flexible insulating layer are different layers, and at least one of the insulating layers is interposed between the first flexible insulating layer and the second flexible insulating layer.

14. A printed circuit board comprising:

a laminate comprising stacked insulating layers including a rigid insulating layer, the rigid insulating layer comprising a first rigid insulating layer and a second rigid insulating layer disposed on both sides of the first rigid insulating layer, wherein the first rigid insulating layer is thicker than the second rigid insulating layer;

a flexible insulating layer comprising a partial region that overlaps and is in contact with at least one of the insulating layers and a remaining region disposed outside of the laminate;

a first antenna disposed on a surface of the laminate; and a second antenna disposed in the laminate and overlapping the first antenna, wherein the second antenna is disposed on a surface of the first rigid insulating layer.

\* \* \* \* \*